(12) United States Patent
Kasturirangan et al.

(10) Patent No.: US 7,898,295 B1
(45) Date of Patent: Mar. 1, 2011

(54) HOT-PLUGGABLE DIFFERENTIAL SIGNALING DRIVER (75) Inventors: Venkatesh Kasturirangan, Bangalore (IN); Vikas Choudhary, Bangalore (IN)

(73) Assignee: PMC-Sierra, Inc., Santa Clara, CA (US)

( * ) Notice: Subject to any disclaimer, the term of this patent is extended or adjusted under 35 U.S.C. 154(b) by 0 days.

(21) Appl. No.: 12/407,269

(22) Filed: Mar. 19, 2009

(51) Int. Cl.
H03K 17/16 (2006.01)
H03K 19/003 (2006.01)

(52) U.S. Cl. .............................. 326/86; 326/30; 326/33; 326/34

(58) Field of Classification Search ........................ None
See application file for complete search history.

(56) References Cited

U.S. PATENT DOCUMENTS

| | | | |
|---|---|---|---|
| 5,510,729 A | 4/1996 | Reymond | |
| 5,959,492 A | 9/1999 | Khoury et al. | |
| 6,111,431 A | 8/2000 | Estrada | |
| 6,114,898 A | 9/2000 | Okayasu | |
| 6,281,715 B1 | 8/2001 | DeClue et al. | |
| 6,288,604 B1 | 9/2001 | Shih et al. | |
| 6,369,621 B1 | 4/2002 | Tinsley et al. | |
| 6,411,146 B1 | 6/2002 | Kuo | |
| 6,421,626 B1 | 7/2002 | Yin | |
| 6,507,218 B1 | 1/2003 | To et al. | |
| 6,566,933 B1 | 5/2003 | Lye | |
| 6,577,154 B2 | 6/2003 | Fifield et al. | |
| 6,600,346 B1 | 7/2003 | Macaluso | |
| 6,731,135 B2 | 5/2004 | Brunolli | |
| 6,812,733 B1 | 11/2004 | Plasterer et al. | |
| 6,867,618 B2 | 3/2005 | Li et al. | |
| 6,873,660 B2 * | 3/2005 | Bu .............. | 375/257 |
| 6,927,608 B1 | 8/2005 | Chen et al. | |
| 6,975,141 B2 | 12/2005 | Mueller et al. | |
| 7,012,450 B1 | 3/2006 | Oner et al. | |
| 7,068,077 B1 | 6/2006 | Reinschmidt | |
| 7,071,739 B1 * | 7/2006 | Duzevik et al. ............. | 327/108 |
| 7,330,056 B1 | 2/2008 | Lu | |
| 7,471,107 B1 | 12/2008 | Fortin et al. | |
| 7,635,990 B1 * | 12/2009 | Ren et al. ..................... | 326/86 |

OTHER PUBLICATIONS

Merriam-Webster's Collegiate Dictionary, Tenth Edition, 1998, p. 1093.*

* cited by examiner

Primary Examiner—Anh Q Tran
(74) Attorney, Agent, or Firm—Knobbe Martens Olson & Bear LLP (57) ABSTRACT Apparatus and methods provide low voltage differential signaling (LVDS) driver with replica circuit biasing and protection for hot plugging. The replica biasing is non-intrusive in nature, and can control the voltage swing tightly over parametric variations. The absence of an explicit near-end driver termination improves efficiency, while replica biasing controls output voltage swing levels. Hot-pluggable compatibility is achieved by a reduction in power-off leakage current and short circuit current protection.

21 Claims, 6 Drawing Sheets

FIG. 1

PRIOR ART

FIG. 6 TIMING DIAGRAM

HOT-PLUGGABLE DIFFERENTIAL SIGNALING DRIVER

BACKGROUND

1. Field of the Invention

The invention generally relates to electronics. In particular, the invention relates to drivers for low voltage differential signaling.

2. Description of the Related Art

Low-Voltage Differential Signaling (LVDS) is a popular technology for high performance data transmission applications. LVDS is growing in popularity for differential data transmission because it features relatively high speed and relatively low-power. Other benefits of LVDS include: low-voltage power supply compatibility; relatively low EMI generation; relatively high noise rejection; robust transmission signals; and an ability to be integrated into system level ICs. LVDS technology allows products to address high data rates ranging from, for example, hundreds of Mbps to greater than 2 Gbps.

LVDS uses differential data transmission to reduce susceptibility to common-mode noise. This permits the swing levels to be lower, which significantly reduces power dissipation. However, maintaining swing levels over wide parametric variations can be challenging. The control of swing level can be an important aspect to an LVDS system, as the worst case swing level defines the power dissipation of the LVDS system.

Figure 1:
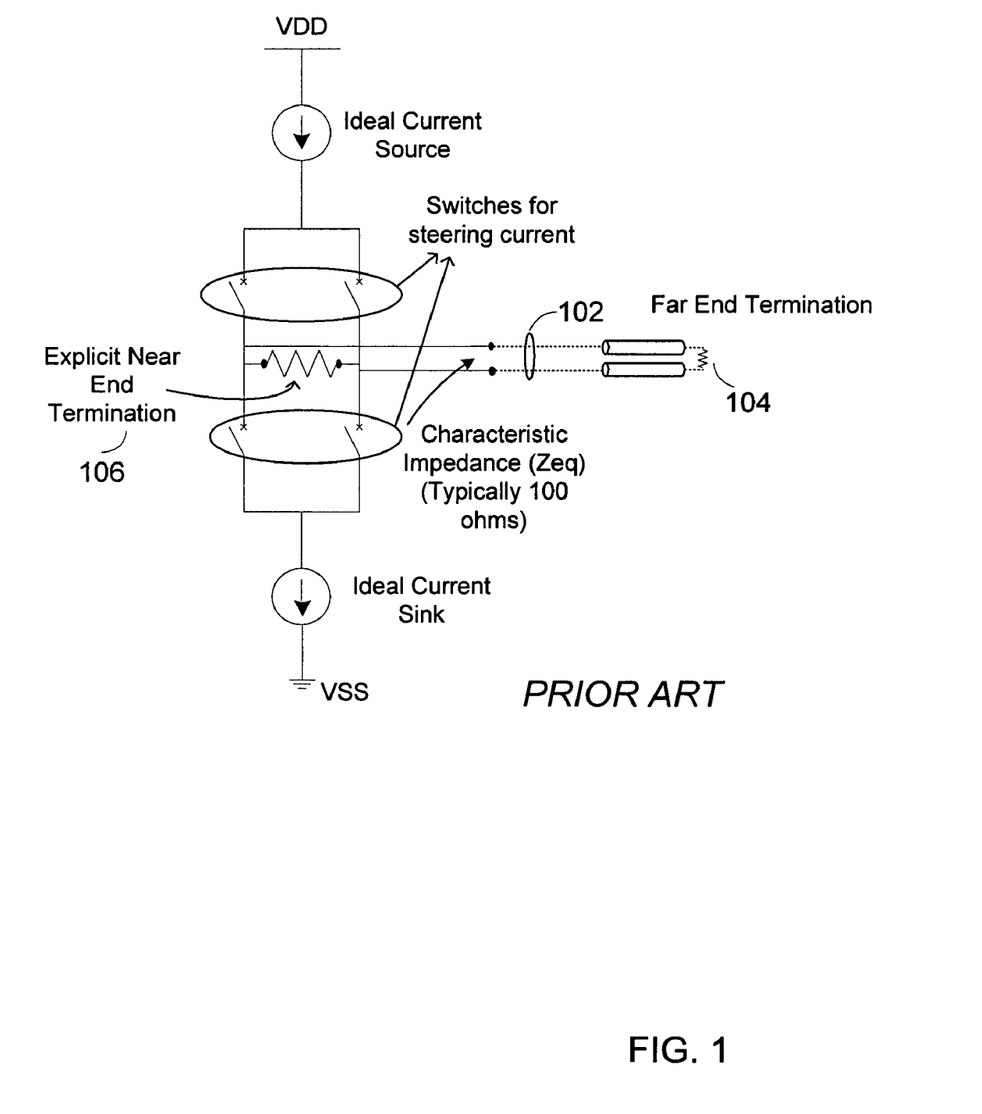
FIG. 1 illustrates a conventional low voltage differential signaling driver (LVDS).

As illustrated in FIG. 1, a transmission medium 102 should be terminated 104 to its characteristic differential impedance to complete the current loop and to terminate the high-speed signals. Termination should be applied whether the LVDS transmission medium includes a cable or controlled impedance traces on a printed circuit board. Typically, to prevent reflections, LVDS also uses a near-end terminating resistor 106 that is matched to the actual cable or PCB trace's differential impedance as close as possible to the driver output. The near-end terminating resistor 106 however results in additional power loss in those resistors.

An LVDS driver is desirably hot-pluggable. A hot-pluggable LVDS driver should not consume an inordinate amount of current through the output pins when switched off. Fault detection of the output pins of the hot-pluggable LVDS driver should be used. Fault detection circuits detect and prevent excessive current flow arising out of, for example, accidental short circuits to power or ground.

FIG. 1 illustrates a conventional approach to an LVDS driver implemented with a constant current driver (also called current mode driver) with explicit near-end passive termination 106. The conventional current mode driver illustrated in FIG. 1 is only about 50% efficient. This is because the current gets divided between the far end termination 104 and the explicit near end termination 106.

FIG. 1 above shows an ideal current driver; however realizable current sources have wide parametric variations, resulting in significant swing variations over the line.

Such schemes would typically require a CMFB (Common Mode Feedback Control) circuit to control the common mode level of the driver. Discussed below are various implementations of the LVDS drivers which are variations on the classical theme discussed above.

For example, U.S. Pat. No. 6,111,431 to Estrada illustrates a current mode driver. However, the Vds (Drain-Source Voltage) of the current sources are pinned to specific values through a feedback system to control the swing level. Such a scheme uses a near-end termination, resulting in power and speed limitations. U.S. Pat. No. 6,600,346 to Macaluso has similar limitations.

U.S. Pat. No. 6,731,135 to Brunolli illustrates another variation of an LVDS driver. In Brunolli, the common mode voltage is provided using a feedback system to control the output swing levels. See, for example, FIG. 3 of Brunolli.

U.S. Pat. No. 6,867,618 to Li, et al., has a low-output impedance structure as compared to high impedance constant current sources. See, for example, FIG. 3 of Li. However, there is no control of the swing levels.

U.S. Pat. No. 7,012,450 to Oner, et al, illustrates a self-termination driver with feedback to control the common mode voltage of the driver. It can be relatively intrusive to perform feedback control of common mode voltage because the feedback path is then embedded in the signal path (differential or common mode). In addition, the feedback control controls only the common mode voltage and not the differential swing. Thus, the differential signal swing still varies over process, voltage, and temperature (PVT) corners.

FIG. 2 of U.S. Pat. No. 6,411,146 to Kuo illustrates tracking a substrate voltage level on a shared bus. Kuo's technique avoids parasitic diode leakage. See also U.S. Pat. No. 7,068,077 to Reinschmidt for relevant art.

SUMMARY

The invention includes a low voltage differential signaling (LVDS) driver with replica circuit biasing and protection for hot plugging. The replica biasing is non-intrusive in nature, and can control the voltage swing tightly over parametric variations. The absence of an explicit near-end driver termination improves efficiency, while replica biasing controls output voltage swing levels. Hot-pluggable compatibility is achieved by a reduction in power-off leakage current and short circuit current protection.

In one embodiment, the circuit is integrated in a solid state integrated circuit and is configured to carry digital data in differential form.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

The low-power and high speed nature of LVDS is achieved by virtue of the relatively low output swing of the driver, which is typically in the range of 250 mV-400 mV. Deviations from this voltage range can result in excessive power loss, thwarting the low-power nature of LVDS. Also, for proper operation of differential signaling at high speed, these drivers should be terminated into an appropriate channel characteristic impedance. However, the flip side of explicit termination is the dissipation of power in the termination resistor 104, 106. When such explicit termination is not used, the impedance of the driver should still be matched to that of the channel characteristic impedance (typically 100 ohms differential).

The widespread adoption of LVDS has necessitated other features, particularly for a shared bus. A local powered-off LVDS driver (local power supply of the driver is held at low-logic level or ground) should not interfere when logic high exists on the shared bus. If not properly designed, a powered-off LVDS driver can leak a relatively large amount of current, typically either through the diodes that are used for the ESD (electrostatic discharge) protection of a corresponding pad or through the parasitic diode formation when using pMOS devices. Thus, an LVDS driver should avoid having a parasitic path from the output pad to the local VDD supply rail.

In addition to the foregoing, an LVDS driver should also have a fault detection feature to handle accidental shorts of the output pads to an external high or low supply rail. Such a fault detection feature should be able to detect excessive current then shut off excessive current flow. The feature should also be able to recover to normal behavior after the fault has disappeared.

Figure 2:
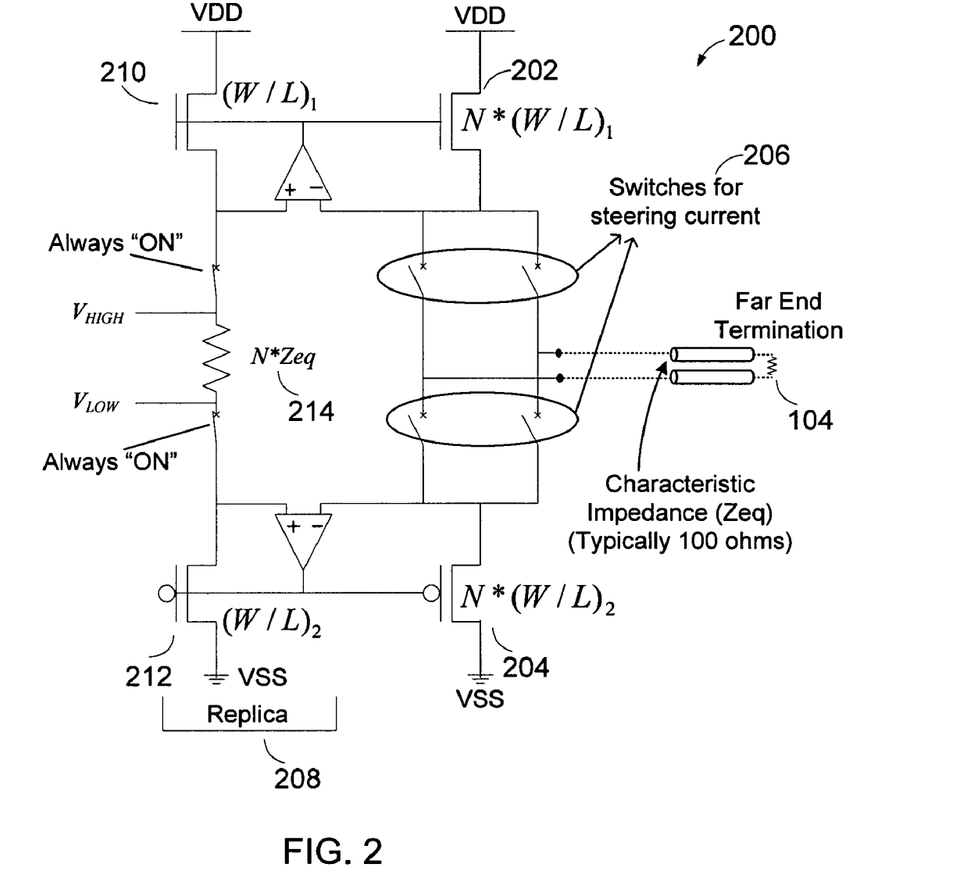
FIG. 2 is a schematic diagram general concepts for the self-terminated driver.

FIG. 2 illustrates an embodiment of a self-terminated driver 200 for LVDS. In contrast to conventional LVDS techniques, the self-termination improves efficiency. For example, many conventional LVDS drivers use a constant current source with some sort of replica feedback to control either the common mode or differential signaling. An LVDS driver using a constant current source, which has a relatively high output impedance characteristic, is typically configured with a near-end explicit termination for high speed operation of the LVDS driver. The conventional configuration is relatively inefficient. The termination is lossy and the efficiency of the driver goes down by 50%, as only half of the current can be launched on the line.

One embodiment of the invention avoids the inefficient use of an explicit termination 106 (FIG. 1) by having the driver devices 202, 204 provide the requisite impedance characteristic. This is achieved by using a source follower configuration (as opposed to the conventional current source/sink configuration) for the devices 202, 204 that provide current to the steering switches 206 as shown in FIG. 2. Thus, the driver 200 is self-terminated with an active termination as opposed to a passive termination. The usage of the source follower configuration does not waste power in the termination devices 106 (FIG. 1) themselves. This results in a high efficiency driver. However, a simple implementation of such high efficiency drivers would be plagued by parametric variation of both the voltage levels and the termination impedance, thereby thwarting the efficiency achieved. The illustrated replica biasing 208 overcomes these problems with variations.

Figure 3:
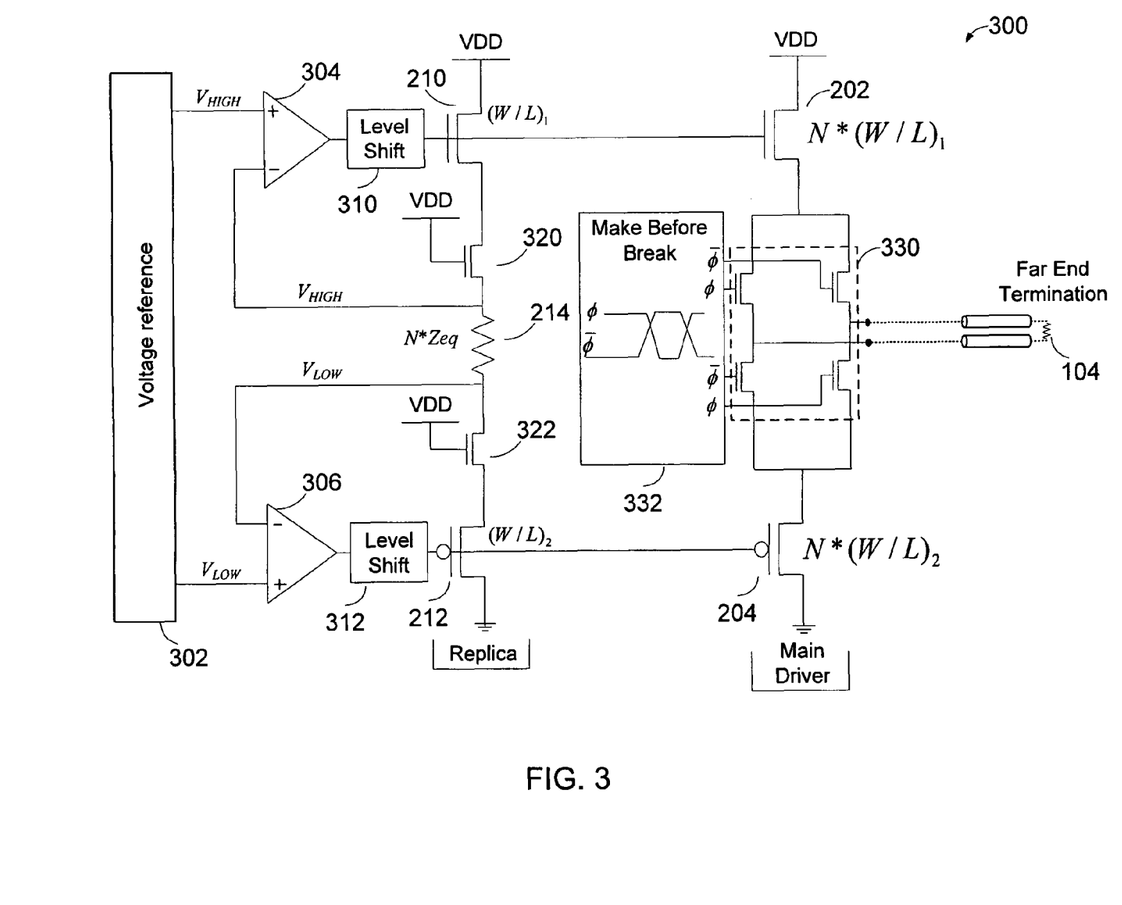
FIG. 3 illustrates further details of the self-terminated driver.

FIG. 2 is a conceptual view of the replica biasing 208 to the left of the schematic. A biasing circuit generates reference levels $V_{HIGH}$ and $V_{LOW}$ (logic reference levels) appearing across the resistor 214. The reference levels can be based on a voltage reference, such as via a band-gap reference or a $V_{DD}$ (Supply) reference. In the illustrated embodiment, the reference levels $V_{HIGH}$ and $V_{LOW}$ correspond to the high and low swing levels, respectively, of the LVDS voltage swing specifications. Voltage reference circuits that are well controlled over PVT (Process Voltage and Temperature) variations are well known in the art. This places bounds on the swing level of the LVDS driver, when the current flow through a scaled value (N) of line-impedance (Zeq) or characteristic impedance can be successfully reflected across the main driver. The driver devices 202, 204 are also scaled by N with respect to the replica devices 210, 212. FIG. 3 illustrates further details of the replica biasing 208. In one embodiment, N is in a range of about 5 to about 20. Other values for N will be readily determined by one of ordinary skill in the art.

FIG. 3 illustrates further details of the LVDS driver circuit with replica biasing. Reference levels $V_{HIGH}$ and $V_{LOW}$ from a voltage reference 302 are provided as inputs to non-inverting inputs of differential amplifiers 304, 306. Outputs of the differential amplifiers 304, 306 are provided as inputs to gates of the replica device 210 and driver device 202, and to gates of the replica device 212 and driver device 204, respectively. In the illustrated embodiment, optional level shifter circuits 310, 312 are used to prevent the outputs of the differential amplifiers 304, 306 from saturating, as the voltage for the gate of the N-channel devices 210, 202 can be close to VDD and the voltage for the gate of the P-channel devices 212, 204 can be close to ground. For example, the level shift circuit 310 can raise the output voltage and the level shift circuit 312 can lower the output voltage. These level shift circuits 310, 312 can be considered to be part of the output stages of the differential amplifiers 304, 306. The steering replica switches 320, 322 can also be scaled by 1/N relative to the size of the steering switches 330.

The source of the replica device 210 is coupled to a first end of the resistor 214 and to an inverting input of the differential amplifier 304, and the source of the replica device 212 is coupled to a second end of the resistor 214 and to an inverting input of the differential amplifier 306. Steering replica switches 320, 322 are always closed (transistors "on"). The steering replica switches 320, 322 replicate the voltage drops of the steering switches 330, which will be described later.

In one embodiment, the resistor 214 corresponds to an on-chip passive resistor having an impedance that should be equal to the scaled value of off-chip characteristic impedance of the line (N*Zeq), where N is the scaling factor (greater than 1) and Zeq is the characteristic impedance of the line to be driven. This scaling N by greater than 1 decreases the current passing through the resistor 214 relative to the resistor 106 (FIG. 1) and boosts the efficiency of the driver circuit 300.

Due to the relative scaling of the devices, the current through the output drivers 202, 204 is N times larger that through the replica devices 210, 212. When the current is launched on a transmission line having characteristic impedance $Z_{eq}$, the swing developed on the line should be $V_{HIGH}$-$V_{LOW}$. For relatively good impedance matching, the output impedance of the drivers 202, 204 should be designed such that they are equal to $Z_{eq}$. This can be achieved through proper sizing of the output source follower such that the relationship expressed in Equation 1 holds.

$$Z_{eq} = R_{swt} + \frac{1}{G_{mp}} + \frac{1}{G_{mn}} \quad \text{(Eq. 1)}$$

In Equation 1, $R_{swt}$ is the impedance (on resistance) of the nMOS switches 330. In Equation 1, $G_{mn}$ and $G_{mp}$ correspond to the small signal transconductance of the output pMOS 204 and nMOS 202 driver devices. For a square law device, the following approximate equations are applicable:

$$R_{swt} = \frac{L}{\mu_n C_{ox}(V_{gs} - V_{th})W} \quad \text{(Eq. 2)}$$

$$G_{mn} = \sqrt{2\mu_n C_{ox}(W/L)I_D} \quad \text{(Eq. 3)}$$

$$G_{mp} = \sqrt{2\mu_p C_{ox}(W/L)I_D} \quad \text{(Eq. 4)}$$

In Equations 2-4, $\mu_n$, $\mu_p$ are the mobility of the electrons and holes, respectively, $C_{ox}$ is the oxide capacitance, per unit area, $V_{gs}$ is the gate-source voltage of a transistor, $V_{th}$ is the threshold voltage of a transistor, $I_D$ is the drain-source current through the transistor and W, L are the width and length of the transistor.

The illustrated replica feedback scheme is unique in at least two aspects: the driver structure has a relatively low output impedance (achieved via a source follower configuration), and the replica biasing scheme is non-intrusive. By non-intrusive, no portion of the feedback circuit is in direct contact with the signal path (either differential or common mode). This property of non-intrusiveness is desirable for LVDS drivers because the output nodes 330 can be connected to a shared bus interface and can be subjected to unpredictable voltage or current variations or have elements that are difficult to model accurately (for example, bond-pad and bond-wire capacitance and inductance). A feedback circuit that encompasses the signal path should be avoided for robustness. Another benefit of the replica feedback circuit is the simplicity of implementation. Prior art feedback circuits have employed replica biases having multiple and coupled feedback loops in the signal path. The illustrated configuration avoids such strongly coupled feedback loops, especially in the signal path.

It should also be noted that in the illustrated embodiment, the current steering switches 206 (FIG. 2) have been implemented by all nMOS switches 330. The control of the steering switches 206, 330 controls the output data of the driver. A "make-before-break" circuit 332 can be used to control the switches 330 to prevent common mode of the output to vary due to charge injection from the switches 330. In addition, the use of only nMOS devices 330 when in proximity to an output pin significantly reduces the power-off leakage as explained in greater detail in the following.

Preferably, LVDS drivers are hot-pluggable. Hot-pluggable LVDS drivers should exhibit relatively small power-off leakage and some form of fault-detection to prevent damage due to accidental shorts of outputs to power or ground. As previously noted, the power-off leakage current should be relatively small. Power-off leakage occurs when the local LVDS driver is powered off (and hence the local VDD rail is at ground), and the output of the local LVDS driver experience a voltage, such as high voltage. Without proper design, in such conditions, a heavy current can flow, resulting in possible damage to the local LVDS driver or to the line or to both.

While conventional LVDS drivers have used nMOS and pMOS device combinations for seamless switching of the currents, one embodiment of the invention uses only all nMOS switches 330 for current steering at the output. The use of only nMOS devices when in proximity to the pad overcomes the problems with power-off leakage. This is because nMOS devices do not have the parasitic diode of pMOS devices. In pMOS devices, the parasitic diode formed from the n-well to local p+ implant regions can turn ON, resulting in excessive current flow during power-off leakage. The usage of nMOS switches however can result in common mode noise through charge injection of the switches. This is averted through employment of "make-before-break" circuit 332. A timing diagram of the circuit will be described later in connection with FIG. 5.

Figure 4:
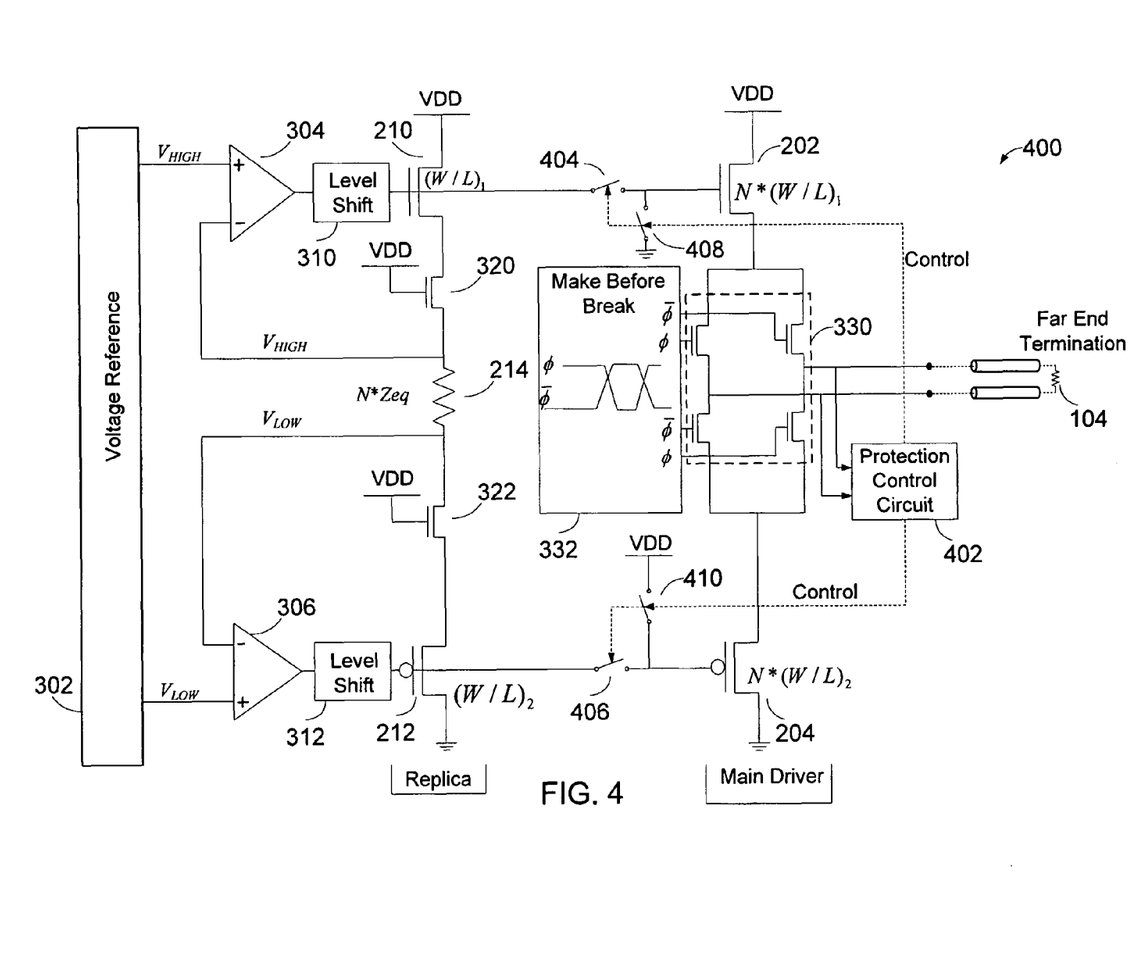
FIG. 4 illustrates an LVDS driver that includes fault-detection.

A driver 400 with short detection and protection is illustrated in FIG. 4. For hot-pluggability, another desirable feature is automatic short-detection (to ground or to power). The condition for short detection is to detect when the output of the driver is at ground (logic low) or VDD supply (logic high).

The illustrated embodiment provides fault protection by sensing the output level and modifying (turning ON or OFF as needed) the gate bias of the output devices 202, 204 as shown in FIG. 4. A protection control circuit 402 can correspond to, for example, a comparator that compares the voltage levels at the output pads (outputs of current steering switches 330) to a set threshold (typically mid-rail). Upon detection of a short, the output of the protection control circuit 402 disconnects the gate bias of the output devices 202, 204 from the replica bias circuit and instead biases the gates to power or ground, as appropriate, ensuring that the output devices 202, 204 are turned OFF. For example, under normal conditions, protection switches 404, 406 are biased ON (switch closed), and switches 408, 410 are biased OFF (switch open). When a short is detected, switches 404, 406 are biased OFF (switch open), and protection switches 408, 410 are biased ON (switch closed).

For example, protection switch 404 can be a transmission gate (analog switch) and protection switch 408 can be an NMOS device or a transmission gate. A transmission gate can be implemented by placing an NMOS and a PMOS in parallel. The gates of these protection switches 404, 408 can be coupled to control signal outputs of the protection control circuit 402 such that switch 404 is closed and switch 408 is open for a normal mode of operation and switch 404 is open and switch 408 is closed for a protected mode of operation. Switch 406 can be a transmission gate and switch 410 can be a PMOS device or a transmission gate. The gates of these protection switches 406, 410 can be coupled to control signal outputs of the protection control circuit 402 such that protection switch 406 is closed and protection switch 410 is open for a normal mode of operation and protection switch 406 is open and protection switch 410 is closed for a protected mode of operation.

The controlling of the activation of the output devices 202, 204 prevents excessive current flow, and thereby prevents the corresponding damage from excessive current flow. The protection control circuit 402 can also include a wake-up circuit to revert back to the normal mode of operation after the fault has disappeared.

Figure 5:
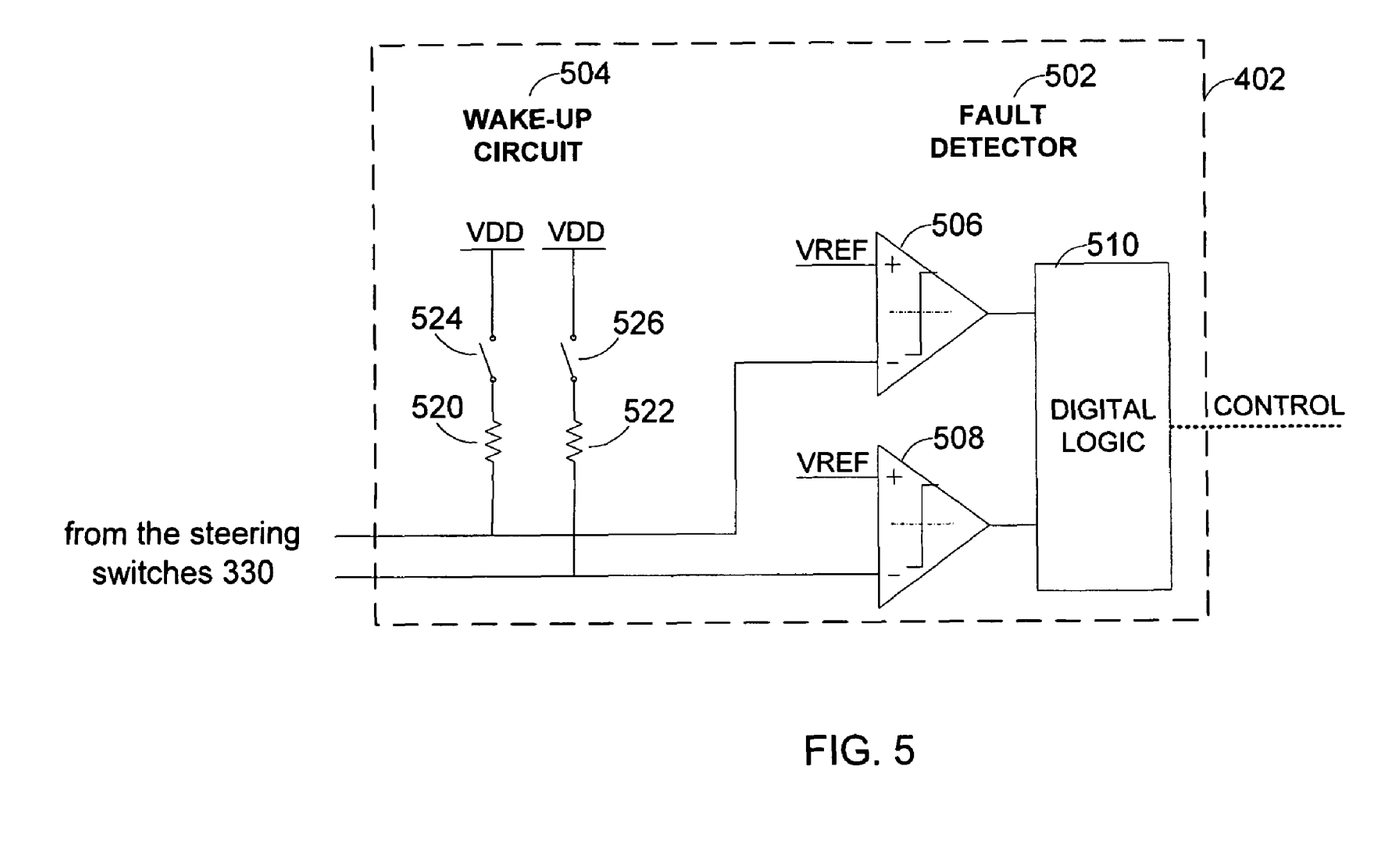
FIG. 5 illustrates further details of a protection circuit.

FIG. 5 illustrates further details of one embodiment of the protection control circuit 402. The circuit of FIG. 5 provides detection of shorts to ground. As will be explained later, detection of shorts to $V_{DD}$ can be implemented by mirroring the circuit. The illustrated protection control circuit 402 has a fault detector 502 and a wake-up or reset circuit 504. The protection control circuit 402 monitors the outputs of the steering switches 330. In the illustrated embodiment, the fault detector 502 compares 506, 508 the outputs to a threshold voltage $V_{REF}$. To detect shorts to $V_{DD}$, threshold voltage $V_{REF}$ is preferably about 0.75 to 0.80 of $V_{DD}$. To detect shorts to ground, threshold voltage $V_{REF}$ is preferably about 0.20 to 0.25 of $V_{DD}$. However, applicable threshold voltages can vary in a very broad range and will be readily determined by one of ordinary skill in the art. When in normal operation, the outputs should be switching from $V_{LOW}$ to $V_{HIGH}$. If the driver outputs have shorted to ground, the short can be detected by the digital logic 510 based on outputs of the comparators 506, 508, which, in the illustrated embodiment, detects that one or both driver outputs are low, resulting in one or both of the outputs of comparators 506, 508 being low. The digital logic 510 generates control signals for control of the switches 404-410 (FIG. 4), which deactivate the driver devices 202, 204. In alternative embodiments, the digital logic 510 can include logic such as exclusive-OR (XOR) gates, and determines a fault when the driver outputs are not opposite to each other.

The wake-up circuit 504 comprises pullup resistors 520, 522 and switches 524, 526. The switches 524, 526 are off or open during normal operation and are on or closed when a fault is detected. In the illustrated embodiment, the switches 524, 526 correspond to NMOS devices, but can alternatively correspond to PMOS devices or to transmission gates. When the fault detector 502 goes into protection mode, the driver devices 202, 204 are turned off for protection (open circuit), and the voltage of the driver output then floats. While the short to ground is still present, the output voltage at the driver outputs will be low. However, when the short disappears, the pullup resistors will eventually pull the voltage on the driver outputs higher than the reference voltage $V_{REF}$ of the comparators 506, 508, and normal operation of the driver circuit is restored. The resistance of the pullup resistors is not critical, as the recovery can be slow. In one embodiment, the resistance of the resistors 520, 522 is about 1 kohms to about 10 kohms. However, other applicable values of resistance will be readily determined by one of ordinary skill in the art.

The circuit of FIG. 5 can be modified for detection of shorts to $V_{DD}$. The positive and negative inputs to the comparators 506, 508 are swapped, and the wake-up circuit 504 is tied to ground ($V_{SS}$) instead of to $V_{DD}$ such that the pullup resistors 520, 522 would operate as pulldown resistors.

Figure 6:
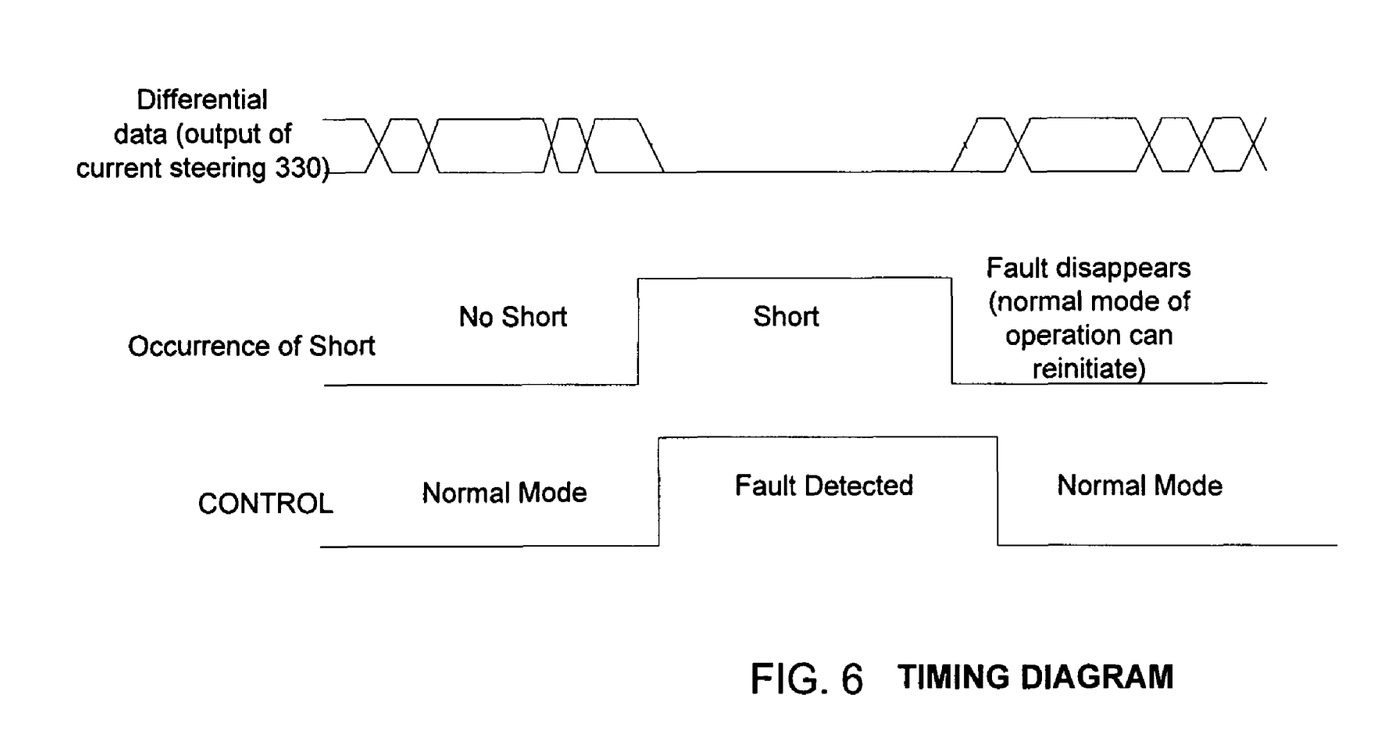
FIG. 6 is a timing diagram, generally illustrating operation of the protection circuit.

FIG. 6 is a timing diagram, generally illustrating operation of the protection control circuit 402 (not to scale). The topmost waveform corresponds to driver circuit outputs (outputs of the current steering switches 330). The middle waveform corresponds to a short condition when high. The lowest waveform corresponds to the detection of the short condition.

Table 1 illustrates an indirect comparison of the power savings of an embodiment of the invention implemented with 65 nanometer (nm) process technology versus a conventional LVDS driver implemented with 90 nm process technology having constant current sources as described earlier in connection with FIG. 1. Applicants note that the comparison is not direct because of the manufacturing process also varies.

TABLE I

|  | Conventional, 90 nm | Embodiment, 65 nm |
|---|---|---|
| Average 3.3 V current | 16.5 mA | 11.0 mA |
| Average 3.3 V power | 54.5 mW | 36.3 mW |
| Total power | 54.6 mW | 36.6 mW |

One embodiment further includes output impedance control. While the output swing is tightly controlled, the output impedance of the LVDS driver illustrated in FIGS. 2-4 varies over process, voltage, and temperature (PVT). The output impedance can be centered on $Z_{eq}$ and a particular desired output impedance can be achieved by proper sizing of the transistors 202, 204 as explained earlier in connection with Equation 1. However, due to PVT variations, the output impedance can vary about +/−20%. This level of output impedance variation is acceptable for LVDS applications.

In one embodiment, when less variability in output impedance is desired, a feedback mechanism can be incorporated to control the impedance variation. For example, an explicit resistor, such as an external resistor can be used as a reference. A voltage or current across such a resistor can form a reference bias current, which can then be used to bias the output devices 202, 204. Such a feedback mechanism can fine-tune the replica bias to control the output swing. The feedback mechanism can be turned off for most of the time during operation, and calibrated once or in the background when the driver circuit is not busy.

LVDS circuits can be used in a very broad range of applications. Examples include, but are not limited to, backplanes, flat panel displays, connections between video boards and display panel boards, digital copiers, printers, routers, switches, set top boxes SCI processor interconnects, and the like. In addition, while illustrated above in connection with LVDS, the principles and advantages described herein are also applicable to other serial interfaces, such as the MIPI D-PHY interface, which can be found in cell phone cameras and displays.

Various embodiments have been described above. Although described with reference to these specific embodiments, the descriptions are intended to be illustrative and are not intended to be limiting. Various modifications and applications may occur to those skilled in the art.

What is claimed is:

1. An apparatus for differential signaling, the apparatus comprising:
a replica bias circuit comprising a replica NMOS transistor and a replica PMOS transistor;
an explicit resistor having a resistance of about N times a characteristic impedance intended to be driven by a main driver circuit, wherein the explicit resistor is operatively coupled in a current path between sources of the replica NMOS transistor and the replica PMOS transistor, wherein N is greater than 1;
the main driver circuit comprising a driver NMOS transistor and a driver PMOS transistor and steering switches;
wherein the driver NMOS transistor is N times larger than the replica NMOS transistor, wherein a source of the driver NMOS transistor is configured to source current to a load via the steering switches;
wherein the driver PMOS transistor is N times larger than the replica PMOS transistor, and is configured to sink current from the load via the steering switches;
wherein outputs of the steering switches comprises a differential output of the main driver circuit, and wherein control of the steering switches controls the differential output data;
a biasing circuit configured to bias the replica NMOS transistor such that the source of the replica NMOS transistor is biased relative to a first reference level $V_{HIGH}$ and configured to bias the replica PMOS transistor such that the source of the replica PMOS transistor is biased relative to second reference level $V_{LOW}$ different from the first reference level, wherein gate and drain voltages of the replica NMOS transistor and the driver NMOS transistor are coupled for replica biasing, and wherein gate and drain voltages of the replica PMOS transistor and the driver PMOS transistor are coupled for replica biasing; and
a protection control circuit and protection switches, wherein the protection control circuit is configured to control the protection switches, wherein in a normal operating mode, the protection switches permit the biasing circuit to bias the driver NMOS transistor and the driver PMOS transistor, and wherein in a protected mode of operation, the protection switches cut off the driver NMOS transistor and the driver PMOS transistor.

2. An apparatus for differential signaling, the apparatus comprising:
a replica bias circuit comprising a replica NMOS transistor and a replica PMOS transistor;
an explicit resistor having a resistance of about N times a characteristic impedance intended to be driven b a main driver circuit wherein the ex a licit resistor is operatively coupled in a current path between sources of the replica NMOS transistor and the replica PMOS transistor, wherein N is greater than 1;
the main driver circuit comprising a driver NMOS transistor and a driver PMOS transistor and steering switches;
wherein the driver NMOS transistor is N times larger than the replica NMOS transistor, wherein a source of the driver NMOS transistor is configured to source current to a load via the steering switches;
wherein the driver PMOS transistor is N times larger than the replica PMOS transistor, and is configured to sink current from the load via the steering switches;
wherein outputs of the steering switches comprises a differential output of the main driver circuit, and wherein control of the steering switches controls the differential output data; and
a biasing circuit configured to bias the replica NMOS transistor such that the source of the replica NMOS transistor is biased relative to a first reference level $V_{HIGH}$ and configure to bias the replica PMOS transistor such that the source of the replica PMOS transistor is biased relative to second reference level $V_{LOW}$ different from the first reference level, wherein gate and drain voltages of the replica NMOS transistor and the driver NMOS transistor are coupled for replica biasing, and wherein gate and drain voltages of the replica PMOS transistor and the driver PMOS transistor are coupled for replica biasing, wherein the biasing circuit comprises a first biasing circuit and a second biasing circuit:
wherein the first biasing circuit comprises a first differential circuit having a positive input, a negative input, and an output, wherein the positive input is referenced to the first reference level, wherein the output is operatively coupled to a gate of the replica NMOS transistor, and wherein the source of the replica NMOS transistor is operatively coupled to the negative input, wherein the first biasing circuit further comprises a first level shift circuit disposed in the signal path between the output of the first differential circuit and the gate of the replica NMOS transistor and a first steering replica switch disposed in the signal path between the source of the replica NMOS transistor and the negative input, wherein the first steering replica switch is configured to replica a first portion of the voltage drop of the steering switch; and
wherein the second biasing circuit comprises a second differential circuit having a positive input, a negative input, and an output, wherein the positive input is referenced to the second reference level, wherein the output is operatively coupled to a gate of the replica PMOS transistor, and wherein the source of the replica PMOS transistor is operatively coupled to the negative input, wherein the second biasing circuit further comprises a second level shift circuit disposed in the signal path between the output of the second differential circuit and the gate of the replica PMOS transistor and a second steering replica switch disposed in the signal path between the source of the replica PMOS transistor and the negative input, wherein the second steering replica switch is configured to replica a second portion of the voltage drop of the steering switch.

3. A method of differential signaling, the method comprising:
biasing a replica NMOS transistor and a replica PMOS transistor such that the source of the replica NMOS transistor is biased relative to a first reference level $V_{HIGH}$ and such that the source of the replica PMOS transistor is biased relative to second reference level $V_{LOW}$ different from the first reference level;
operatively coupling an explicit resistor in a current path between sources of the replica NMOS transistor and the replica PMOS transistor, wherein the explicit resistor has a resistance of about N times a characteristic impedance intended to be driven by a main driver circuit, wherein N is greater than 1;
biasing a gate and drain of a driver NMOS transistor with a gate voltage and a drain voltage of the replica NMOS transistor, wherein the driver NMOS transistor is N times larger than the replica NMOS transistor, wherein a source of the driver NMOS transistor is configured to source current to a load via the steering switches;
biasing a gate and drain of a driver PMOS transistor with a gate voltage and drain voltage of the replica PMOS transistor, wherein the driver PMOS transistor is N times larger than the replica PMOS transistor, and is configured to sink current from the load via the steering switches;
generating a differential output of the main driver circuit at outputs of steering switches, wherein control of the steering switches controls the differential output data, wherein the steering switches, the driver NMOS transistor, and the driver PMOS transistor are part of the main driver circuit; and
detecting a short condition, and cutting off the driver NMOS transistor and the driver PMOS transistor at least during the short condition.

4. An apparatus for differential signaling, the apparatus comprising:
means for biasing a replica NMOS transistor and a replica PMOS transistor such that the source of the replica NMOS transistor is biased relative to a first reference level $V_{HIGH}$ and such that the source of the replica PMOS transistor is biased relative to second reference level $V_{LOW}$ different from the first reference level;
an explicit resistor in a current path between sources of the replica NMOS transistor and the replica PMOS transistor, wherein the explicit resistor has a resistance of about N times a characteristic impedance intended to be driven by a main driver circuit, wherein N is greater than 1;
means for biasing a gate and drain of a driver NMOS transistor with a gate voltage and a drain voltage of the replica NMOS transistor, wherein the driver NMOS transistor is N times larger than the replica NMOS transistor, wherein a source of the driver NMOS transistor is configured to source current to a load via the steering switches;
means for biasing a gate and drain of a driver PMOS transistor with a gate voltage and drain voltage of the replica PMOS transistor, wherein the driver PMOS transistor is N times larger than the replica PMOS transistor, and is configured to sink current from the load via the steering switches;

means for generating a differential output of the main driver circuit at outputs of steering switches, wherein control of the steering switches controls the differential output data, wherein the steering switches, the driver NMOS transistor, and the driver PMOS transistor are part of the main driver circuit; and means for detecting a short condition, and means for cutting off the driver NMOS transistor and the driver PMOS transistor at least during the short condition.

5. The apparatus of claim 1, wherein N is in a range from 5 to 20.

6. The apparatus of claim 1, wherein the explicit resistor is integrated into an integrated circuit.

7. The apparatus of claim 1, wherein the circuit is configured to carry digital data.

8. The apparatus of claim 1, wherein each of the steering switches is an NMOS transistor.

9. The apparatus of claim 1, wherein the protection control circuit further comprises a comparator circuit configured to compare each line of the differential output of the main driver circuit to a voltage reference to determine whether or not a fault exists, the protection control circuit further comprising pullup resistors coupled to each line of the differential output, wherein the pullup resistors are active at least when a fault has been detected, wherein the pullup resistors permit reset of the protection control circuit.

10. The apparatus of claim 9, wherein the pullup resistors are active at least when a fault corresponding to a short to ground is detected, wherein the protection control circuit further comprises pulldown resistors coupled to each line of the differential output, wherein the pulldown resistors are active at least when a short to $V_{DD}$ has been detected, wherein the pulldown resistors permit reset of the protection control circuit.

11. The apparatus of claim 1, wherein the biasing circuit comprises a first biasing circuit and a second biasing circuit:

wherein the first biasing circuit comprises a first differential circuit having a positive input, a negative input, and an output, wherein the positive input is referenced to the first reference level, wherein the output is operatively coupled to a gate of the replica NMOS transistor, and wherein the source of the replica NMOS transistor is operatively coupled to the negative input; and wherein the second biasing circuit comprises a second differential circuit having a positive input, a negative input, and an output, wherein the positive input is referenced to the second reference level, wherein the output is operatively coupled to a gate of the replica PMOS transistor, and wherein the source of the replica PMOS transistor is operatively coupled to the negative input.

12. The apparatus of claim 1, further comprising a feedback circuit configured to control an output impedance of at least the driver NMOS transistor and the driver PMOS transistor.

13. The method of claim 3, wherein N is in a range from 5 to 20.

14. The method of claim 3, wherein each of the steering switches is an NMOS transistor.

15. The apparatus of claim 4, wherein N is in a range from 5 to 20.

16. The apparatus of claim 4, wherein each of the steering switches is an NMOS transistor.

17. The apparatus of claim 2, wherein N is in a range from 5 to 20.

18. The apparatus of claim 2, wherein the explicit resistor is integrated into an integrated circuit.

19. The apparatus of claim 2, wherein the circuit is configured to carry digital data.

20. The apparatus of claim 2, wherein each of the steering switches is an NMOS transistor.

21. The apparatus of claim 2, further comprising a feedback circuit configured to control an output impedance of at least the driver NMOS transistor and the driver PMOS transistor.

* * * * *